United States Patent [19]

Beiley et al.

[11] Patent Number: 5,724,295

[45] Date of Patent: Mar. 3, 1998

[54] PARTITIONED DYNAMIC MEMORY ALLOWING SUBSTITUTION OF A REDUNDANT CIRCUIT IN ANY PARTITION AND USING PARTIAL ADDRESS DISABLEMENT AND DISABLEMENT OVERRIDE

[75] Inventors: Mark Adam Beiley, Burlington; Charles Edward Drake, Underhill; Thomas Edward Obremski, South Burlington, all of Vt.

[73] Assignee: International Business Machines Corporation, Armonk, N.Y.

[21] Appl. No.: 473,594

[22] Filed: Jun. 7, 1995

[51] Int. Cl.$^6$ ............................................. G11C 7/00
[52] U.S. Cl. .................. 365/222; 365/230.03; 365/200; 365/189.07; 365/195; 365/225.7; 371/10.2; 371/10.3
[58] Field of Search .................. 365/222, 230.03, 365/200, 189.07, 195, 225.7; 371/10.2, 10.3

[56] References Cited

U.S. PATENT DOCUMENTS

| | | | |
|---|---|---|---|
| 4,811,298 | 3/1989 | Helwig et al. | 365/200 |
| 5,243,570 | 9/1993 | Saruwatari | 365/201 |
| 5,511,028 | 4/1996 | Nam | 365/200 |
| 5,517,450 | 5/1996 | Ohsawa | 365/200 |
| 5,528,539 | 6/1996 | Ong et al. | 365/200 |

*Primary Examiner*—David C. Nelms
*Assistant Examiner*—Andrew Q. Tran
*Attorney, Agent, or Firm*—Whitham, Curtis, Whitham & McGinn; H. Daniel Schnurmann

[57] ABSTRACT

A small number of redundant circuits are freely allocable to any of a plurality of partitions or systems within an integrated circuit, such as a large dynamic random access memory (DRAM) consistent with the provision of parallel simultaneous refresh of corresponding addresses in all partitions or systems thereof. A valid address of a redundant circuit substituted for a partial address of a circuit in any partition or system is detected to disable refresh of that address in all partitions. The partition in which the substitution has been made is sensed and the disablement of refresh of all other partitions is overridden so that all partitions or systems in which a substitution has not been made may be refreshed concurrently with the substituted redundant circuit.

11 Claims, 4 Drawing Sheets

PARTITIONED DYNAMIC MEMORY ALLOWING SUBSTITUTION OF A REDUNDANT CIRCUIT IN ANY PARTITION AND USING PARTIAL ADDRESS DISABLEMENT AND DISABLEMENT OVERRIDE

BACKGROUND OF THE INVENTION

1. Field of the Invention

The present invention generally relates to dynamic memories such as may be used in cache architectures and other refreshable circuits and, more particularly, to memories which are partitioned for purposes such as expediting refresh and which include redundancy structures.

2. Description of the Prior Art

A basic element of data processors is the random access memory which allows rapid storage and retrieval of data in direct response to the central processor in order to increase speed of operation of the overall system. Modern data processors, in particular may use several levels of caching in connection with prediction algorithms so that data or commands or both will be retrieved from a system memory and placed in a smaller very high speed memory in advance of a need for the data or commands by the central processor. The overall system performance is substantially affected by the proportionate number of times that calls from the central processor for data or commands can be satisfied from the cache memory rather than having to fetch data or commands from main storage which may also have a longer response time; the latter circumstance being referred to as a cache miss.

The number of cache misses can be reduced in significant degree by the storage capacity of the cache. This fact, together with the greater capacity and lower cost per bit of storage of dynamic memory chips has led to the development of cache architectures using dynamic random access memories (DRAM's) which individually may be of very large capacity in order to provide large cache storage capacity. The individual storage capacity of each chip is also much greater for dynamic memories where the memory cell is a single capacitor than for static random access memories (SRAMs) where the storage cell is a bistable circuit comprised of a plurality of transistors.

However, since the mechanism of data storage in dynamic memories is capacitive charge storage which is subject to leakage, dynamic memories require periodic refreshing in order to maintain the data stored therein. Refreshing of a memory requires access to each memory cell to be refreshed, in sequence. While such access may be performed autonomously at high speed and without processor intervention, a substantial amount of time is required which may approach or even exceed the amount of time the memory is available for read and write access operations. As such, the refresh operation presents a substantial obstacle to reduction of average access time. The speed of the refresh operation for any cell is limited by the need to sense cell contents with a sense amplifier which requires substantial time for response. Therefore, overall gains to be obtained at the present state of the art in reduction of refresh time by increase of speed of refresh operations are also very limited. The time required for refresh thus increases proportionally with DRAM capacity.

Known effective techniques of reducing refresh time include partitioning the memory so that a cell in each partition may be simultaneously refreshed. This technique is highly effective in large DRAMs since a single partition of the memory chip into two memory cell arrays approximately halves refresh time; further partitioning of two memory arrays into four memory arrays again halves the refresh time, and so on. Therefore, partitioning is generally included in DRAM architectures where more than one megabit of storage is provided.

It should be understood that the term "partition" and variants thereof as used herein is intended to connote an addressable circuit system or sub-system which includes an array of circuits and additional circuitry sufficient to provide simultaneously unique selection between circuits in the respective partitions of the array of the system or subsystem; as distinguished from usages which may connote a sub-array or range of addresses which are individually addressed or selected at any given time by the same circuitry used to address or select from another sub-array.

Since DRAMs formed at high integration densities may, at the current state of the art, include several millions of storage cells and many additional components to provide uniquely addressable access thereto, the possibility of improper formation of at least one component on any particular chip is sufficiently large to cause unacceptably low manufacturing yields of fully operational devices even though manufacturing processes are well-refined and highly reliable. For this reason, it is customary to provide redundant structures which can be substituted for structures in which an inoperable or marginally operable cell (or potentially many more such cells) is found.

Such redundant structures are, at the present state of the art, usually provided on at least a word line basis (redundant bit lines which may be substituted for a bit line containing a defective or marginally operable circuit are usually included) for statistical and economic reasons. The present invention will be discussed assuming a convention of refresh on a word line basis, although the principles of the invention can be applied to other articulations of memory and redundant structures.

Substitution of an entire word line and associated memory cells makes it irrelevant how many cells associated with a particular word line may have marginal performance and avoids the need for diagnostics within a word line of memory cells. Further, the current state of the art in the manufacture of high capacity DRAMs is such that only a small fraction of one percent of the word lines will contain one or more inoperative or marginally operative cells. That is, in a 4 Mbit DRAM having over two thousand word lines, the great majority of devices will have unreliable cells on ten or fewer word lines. Therefore, a relatively few redundant word lines provided when the DRAM chip is fabricated will provide for completely reliable operation of virtually all chips.

When redundant structures are used to replace less functional similar structures on a chip, however, it is imperative that the replaced structure not thereafter be energized or driven during operation (either access or refresh) of the device since the response of the replaced structure is unpredictable, particularly in combination with the replacement structure if two circuits attempted to deliver different signals to the same internal nodes or output terminals. Simple disconnection of a defective or marginal circuit together with addressing of a redundant circuit which has been substituted with fuses provided in a fuse bay fabricated on the chip for each redundant circuit is generally adequate to achieve adequate disconnection of the replaced circuit and assure that only the replacement circuit is driven or energized during access or refresh. However, provision for disconnection of input and output of a defective circuit in a large memory, for example, would require the provision of the same number of fuses and anti-fuses as potentially defective circuits (e.g. 2K fuses for a memory including 2K word lines) in addition to the number of fuses and/or anti-fuses which would be required for suitable address decoding and selection of a redundant circuit for each defective or marginal circuit. Accordingly, selection and substitution is usually limited to programming at the decoder level, which is usually sufficient to the purpose if driving of the replaced circuit can be avoided.

A problem occurs, however, when the memory is partitioned for purposes such as reducing refresh time as described above since the lower order address bits are common to all partitions of the memory. Thus, an address which is still valid for operable structure in any partition may not be wholly invalidated. In other words, invalidation and substitution of an address would amount to substitution of redundant structures for corresponding structure at that address in all partitions when the likelihood of need for substitution at the same address of two partitions is extremely small. In such a case, redundant circuits would be likely to replace a substantial number of fully functional circuits and a much greater number of redundant circuits as well as substitution circuitry and fuse bays would be required.

One possible solution would be to provide dedicated redundant circuits associated with each partition. However, inoperative or marginally operative circuits will be randomly distributed over the partitions on a chip and there is a substantial probability that the number of replacements required in any single partition could vary widely.

The number of redundant circuits which is most efficiently provided is several less than an integral power of two (e.g. six, fourteen, thirty, etc.) because of practical matters of efficient addressing and selection. Therefore any substantial likelihood of any chosen one of these numbers being exceeded in a single partition causes a substantial tradeoff between manufacturing yield and the cost of redundant circuits in chip space for the redundant circuits and their associated overhead (e.g. buffers, sense amplifiers, fuse bays, decoder logic, etc.) which may actually be needed in only a relatively small fraction of the chips produced due to the inflexibility of redundant circuits being dedicated to particular partitions. That is, due to the inflexibility of dedication of redundant circuits to particular partitions and the likelihood that the number of replacements which would be required in a single partition would exceed, for example, six for an economically significant number of chips, it would be necessary to provide fourteen redundant circuits for each partition or system of the chip even though the total number of redundant circuits required for the entire chip might exceed, for example, ten, only rarely.

Accordingly, an architecture and methodology for avoiding the need for such an excess number of redundant circuits and providing the flexibility of associating any redundant circuit to any partition or system of a chip which has not previously been accomplished is of substantial economic importance and, in particular, a major key to the application of DRAM chips to cache architectures for improved data processor performance.

SUMMARY OF THE INVENTION

It is therefore an object of the present invention to provide a circuit architecture applicable, for example, to a DRAM memory and which is partitioned for parallel, concurrent refresh of all partitions and which also includes redundant circuits which may be freely allocated to any partition of the circuit.

It is another object of the invention to provide a flexible redundancy system which is compatible with partitioning of systems such as DRAM's for purposes such as parallel refresh and which covers multiple partitions.

It is a further object of the invention to provide a redundancy system for large memories with minimal redundant circuitry and addressing overhead.

It is yet another object of the invention to provide a redundant circuit system which precludes the driving of defective or marginally operative elements which have been replaced.

It is another further object of the invention to provide for simultaneous refreshing of multiple partitions of a memory within a single redundant circuit system.

In order to accomplish these and other objects of the invention, a method of operating a refreshable electronic device which has been divided into a plurality of addressable circuit systems and including a plurality of redundant circuits is provided including the steps of detecting a partial address corresponding to a circuit within an addressable circuit system for which a redundant circuit has been substituted, disabling energization of the partial address detected in said detecting step in all addressable circuit systems of said electronic device, and overriding said disabling step at said partial address in all other addressable circuit systems of said plurality of addressable circuit systems of said electronic device.

In accordance with another aspect of the invention, an electronic circuit is provided including a plurality of systems of addressable elements, a plurality of redundant circuits which can be substituted for portions of any of the systems of addressable elements, and an arrangement for driving at least one addressable element at a partial address in at least one of the plurality of systems of addressable elements simultaneously with at least one redundant circuit which has been substituted for at least one addressable element at the same partial address in another system of addressable elements.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
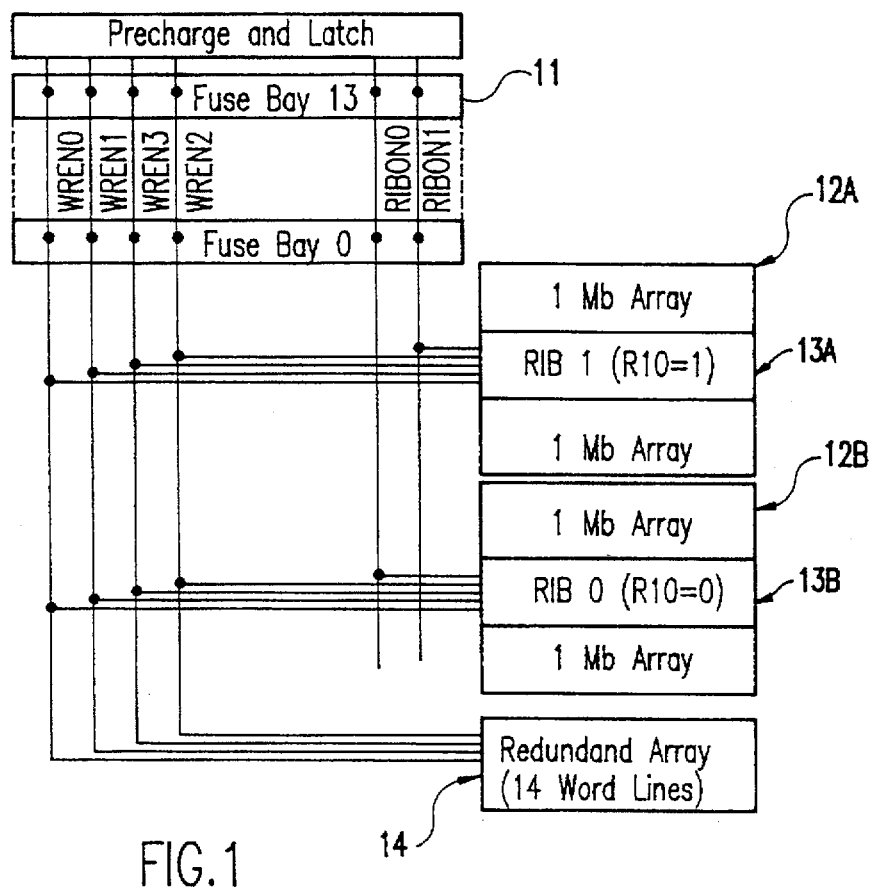
FIG. 1 is a high level schematic diagram of a DRAM architecture in accordance with a preferred embodiment of the invention.

Referring now to the drawings, and more particularly to FIG. 1, there is shown a high level schematic diagram of a DRAM refresh architecture 10 in accordance with the invention. It is to be understood that addressing circuitry other than the portion necessary for an understanding of the invention are omitted in the interest of clarity and the connection of the fuse bays 11 is depicted in a highly schematic and simplified form which will, nevertheless be understood by those skilled in the art, particularly when considered in combination with the accompanying schematic diagrams of a preferred form of the invention provided in FIGS. 2-6. Likewise, latches, buffers, decoders and other circuits which would be included in the row input buffer sections of each partition are well-understood in the art and the particular implementation is not important to an understanding of the principles or practice of the invention and are thus omitted in the interest of clarity.

The DRAM architecture 10 shown in FIG. 1 depicts the memory as being partitioned into two 2-Megabit system arrays, 12A and 12B, each of which is addressed through 1K word lines which are selectively activated in response to an 11-bit row address which is provided to and latched into a row input buffer rib 13A, 13B for each respective partition array 12A, 12B. It is to be understood, however, that the principles of the invention are applicable in the same manner as will be described below to any number of partitions or systems of addressable circuits or elements.

During normal access (e.g. non-refresh) the 11-bit address and a 1-bit fuse enable address is compared bit-by-bit to a coded combination of programmed fuses or anti-fuses in fuse bays 11 which are programmed during chip manufacture in response to testing of the memory chip in a manner well-understood in the art. If all bits of the address and the fuse enable bit compare, indicating that a redundant word line circuit in redundant array 14 has been substituted for that word line, a 4-bit redundant circuit address is asserted on a 4-bit wide redundant circuit address bus comprising connections WREN0-WREN3 and preferably embodied in precharged dynamic circuitry. This bus could be of greater width if more than fourteen (e.g. thirty, sixty-two, etc.) redundant circuits are provided in redundant array 14. If, however, the address bits and the fuse enable bit do not compare, as would be the case when no redundant circuit substitution was made and the fuse enable bit did not compare (or, possibly, a larger address could be compared, either internally or externally, to indicate an address on another chip), all of the WREN lines are driven to the same logic state (e.g. high). (While the code selected for indicating no redundant circuit substitution is theoretically arbitrary, a code having all bits of the same logic level simplifies detection circuitry. Between the combinations 1111 and 0000, the use of 1111 is preferred for this purpose since n-channel FETs can provide a stronger and more rapid transition from logical "1" to logical "0" and logical "1" is thus chosen for the precharge level of the WREN lines. Accordingly, detection of the combination 1111 can be done somewhat more rapidly since no transition need be accommodated.) Thus, when any WREN line is of the opposite logic state (e.g. low), that condition may be readily detected with a simple AND circuit located for example, in predecoders in the row input buffers RIB0 and RIB1 and the driving or firing of a word line inhibited (subject to an override, as will be discussed below).

The condition of all WREN lines being driven to the opposite logic state (e.g. low) is preferably unused but could address another redundant circuit or be used to control another function such as accommodating the condition when the same word line in both partitions has redundant circuitry substituted. However, this latter condition is sufficiently rare that circuitry required to accommodate that condition is considered to be unjustified.

Although not shown in FIG. 1, there is also a REFN signal provided to RIB0 and RIB1 which is asserted during a two word line (one in each array 12A, 12B) refresh cycle. During normal operation, the highest order address bit is preferably used to select between RIB0 and RIB1. However, during a refresh cycle, both or all RIBs are preferably enabled but if word line redundancy generates a compare, the redundant circuit in array 14 would be addressed but the word line corresponding to the complement high order address bit (e.g. the eleventh bit, A10, of the address) of the regular array 12A or 12B would not be refreshed. To avoid this function, in accordance with the inventions, only the lower order (e.g. n-1 or A0-A9) address bits, forming a partial address sufficient for addressing all addressable circuits within any partition, and the enable bit are compared and the REFN signal together with the A10 signal are used to develop an override signal to cause refresh of the partition or partitions of the regular array which would not otherwise be refreshed. A preferred circuit for development of these functions, as described above, will now be described in connection with FIGS. 2-5.

Figure 2:
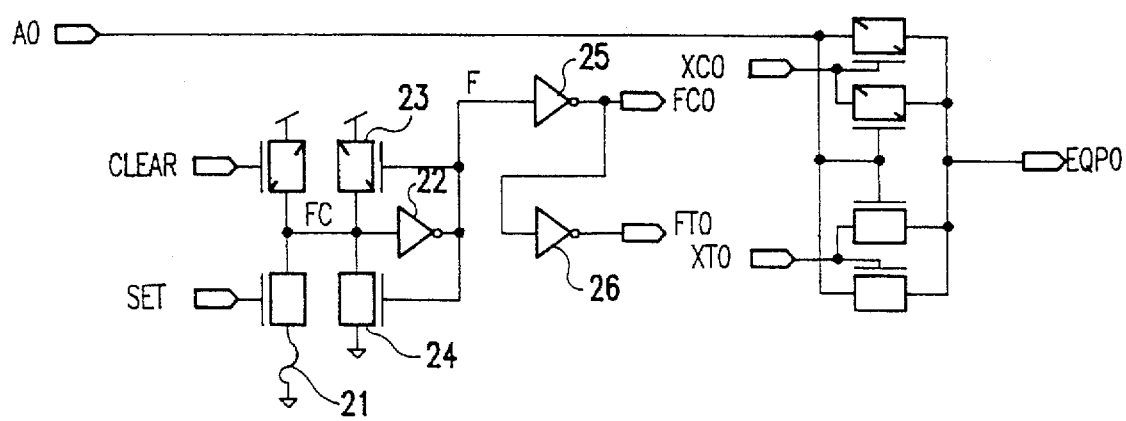
FIG. 2 is a schematic diagram of a preferred form of an address comparator circuit in accordance with the invention.

Specifically, FIG. 2 shows a preferred form of address comparator for comparing each of address bits A0-A9 and the enable fuse. Therefore, in the preferred form of the invention, eleven of these circuits will be required; two being shown with modifications in FIG. 3. The circuit, itself, is depicted in two sections and, when implemented FC0 will be connected to XC0 and FT0 will be connected to XT0, as shown by dashed lines.

The portion of the circuit shown in the upper and right portions of FIG. 2 includes two pairs of transistors of opposite conductivity types connected as transmission gates: the gates of one transistor of each pair being connected to receive the appropriate address bit, symbolically indicated as A0, and the conduction terminals connected respectively to the true and complement outputs of the other portion of the circuit. The conduction terminals of the other transistors of each pair are connected to receive the appropriate address bit, symbolically indicated as A0, and the conduction terminals are connected respectively to the true and complement outputs of the other portion of the circuit. Thus, this portion of the circuit will function as an AND gate and provide an EQP0 output =logic "1" only when XC0 (FC0) and A0 are both high.

The portion of the circuit shown at the lower left portion of FIG. 2 is an initialization circuit to sample and hold the fuse state upon power-up of the circuit with little current draw thereafter. Specifically, a first pair of transistors of opposite conductivity type are arranged in series and receive set and clear inputs on their respective gates. In the preferred form of the invention, the clear input is asserted low on power up to precharge node FC. At any later time, a set input may be applied to the other transistor and will pull node FC low only if the fuse 21 is intact.

Also connected to receive the voltage at node FC is an inverter 22, the output of which is inverted and fed back from node F to node FC by one of transistors 23, 24 of opposite conductivity types (and which may be of relatively low conductance) thus completing a latch for the signal on node FC. The remainder of the circuit preferably comprises two serially connected inverters 25, 26 so that the FC0 output will be of the same logic level as node FC and its complement FT0 will be a logic "1" when the fuse 21 is blown.

Figure 3:
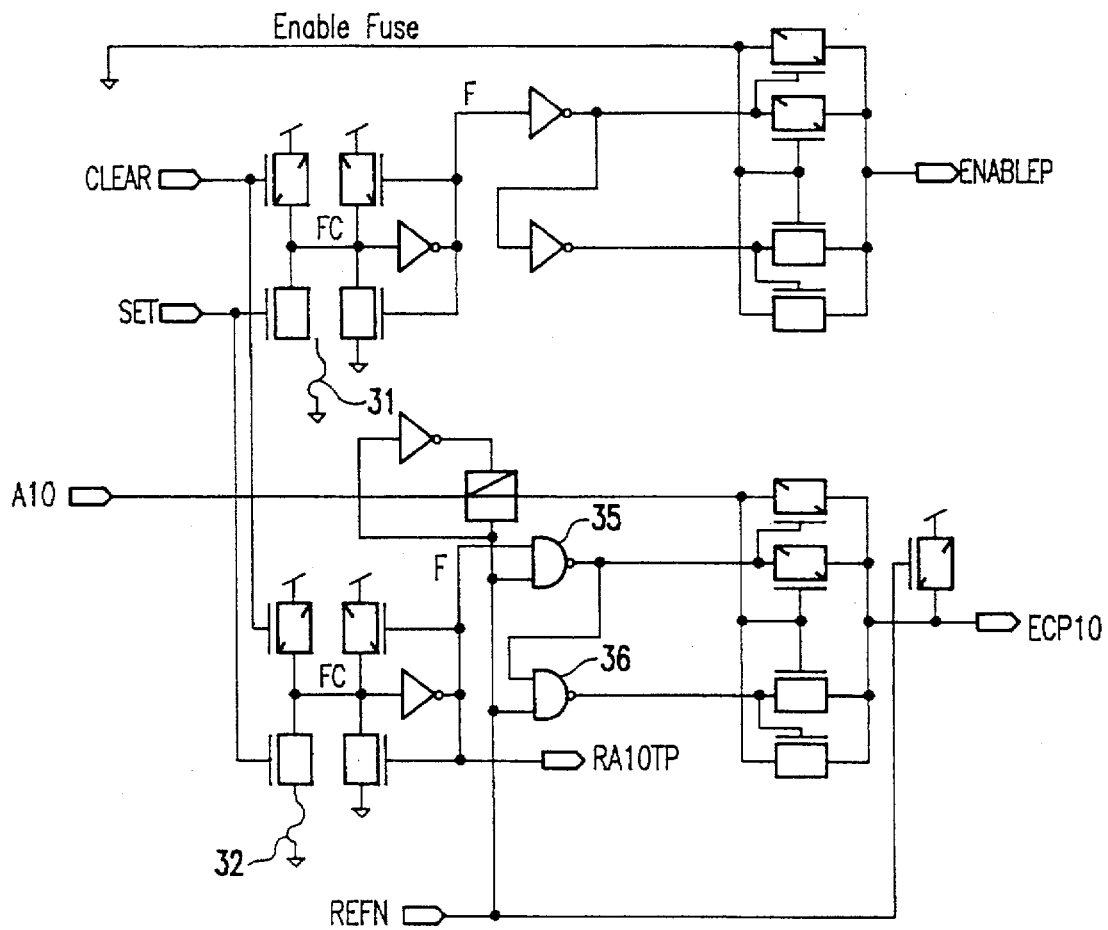
FIG. 3 is a schematic diagram of a preferred form of an enable fuse address comparator circuit in accordance with the invention.

The circuit of FIG. 3 is of similar form but substantially duplicated. The common connection of the set and clear inputs is also exemplary of how the plurality of the circuits of FIG. 2 are preferably connected. The upper part of the circuit exactly duplicates that of FIG. 2 except that the connection to the A0 input of FIG. 2 is connected directly to ground for detection of continuity of the enable fuse 31. The output ENABLEP is ANDed with all the signals EQP0–EQP10 to develop the compare positive, COMPP, signal when all the COMPP and EQP0–EQP10 signals are active which is input to the circuit of FIG. 4, as will be described below.

The lower part of the circuit is similar but contains a pass gate in the A10 input line which is controlled by REFN which is active low to indicate a refresh operation. REFN also provides an input to each of a pair of AND gates 33, 34 which are substituted for inverters 25, 26 of FIG. 2. Thus, the highest order address bit (or bits if the invention is applied to a circuit having four or more partitions) and the signal reflecting the state of the corresponding address fuse may be blocked during the refresh operation and the comparison disabled while EQP10 is pulled high during the refresh operation although the comparison will occur as with other address bits during normal access. However, it should be noted that the signal on node F of this lower portion of the circuit of FIG. 3 is not gated and is available to indicate the state of fuse 32 as RA10TP regardless of whether the operation is for normal access of refresh. It should be recalled, in this regard, that when a redundant circuit is substituted, refresh of both arrays 12A and 12B is inhibited by the circuit thus far described (e.g. when any of lines WREN0–WREN3 is low, indicating an address has been provided for a redundant circuit) while refresh is provided in the redundant circuit addressed by the coded combination of signals of WREN0–WREN3. The provision of refresh at the location specified by the partial address A0–A9 to the partition which has not had a redundant circuit substituted will now be described.

Specifically, RA10TP is used thereafter to generate an override signal during refresh in order to provide refresh of the memory array which has not had redundant circuitry substituted at the partial address specified by address bits A0–A9. Recalling that, in the preferred articulation of the invention, address bit A10 is used to specify one of memory arrays 12A and 12B, the fuse to be compared with address bit A10 will indicate if a redundant circuit has been substituted in the memory array at the address specified by the remainder of the address bits A0–A9, the signal RA10TP, appearing on node F and which is the complement of the signal on node FC, will be high if the fuse is blown, indicating a redundant circuit, but low when the fuse is intact. Thus RA10TP can be decoded by an inverter and two NAND gates (or equivalent logic) which also receive the refresh signal REFN and the compare positive signal COMPP (thus indicating both a refresh operation and a word redundancy compare) to provide an active (preferably) low signal RIBON0 or RIBON1 (row input buffer override negative), also shown in FIG. 1, to the row input buffer predecoder for one of the memory arrays 12A, 12B in response to the logic state of the RA10TP signal. The operation of this override signal will now be discussed in connection with the predecoder circuit illustrated in FIG. 5.

It should also be noted in this regard that the RA10TP signal, in the two partition embodiment described, is a direct function of the state of fuse 32 with which the A10 address bit is compared. If more partitions are provided additional address bits and fuses 32 will be available for generation of similar signals which can be used to generate counterparts of the RIBON0 and RIBON1 signals for additional partitions. Instead of the simplifying constraint, alluded to above, in which no substitution would be possible if redundant circuits were required in both partitions or systems 12A and 12B at the same address, the counterpart assumption would be that no redundant circuit substitution would be done if redundant circuits were required at the same lower order address in any pair of partitions. While this constraint might seem to have the potential for reducing manufacturing yield in large circuits, a very simple and small high order bit decoder or even rearrangement of true and complement high order input address signals could reallocate the partitions to high order addresses such that redundant circuit substitution would be effective to increase manufacturing yield unless more than half of the partitions had defects at the same lower order address. This latter circumstance would be extremely rare and, if encountered, would be highly indicative of a process error such as a replicated defect in a lithography mask.

Figure 5:
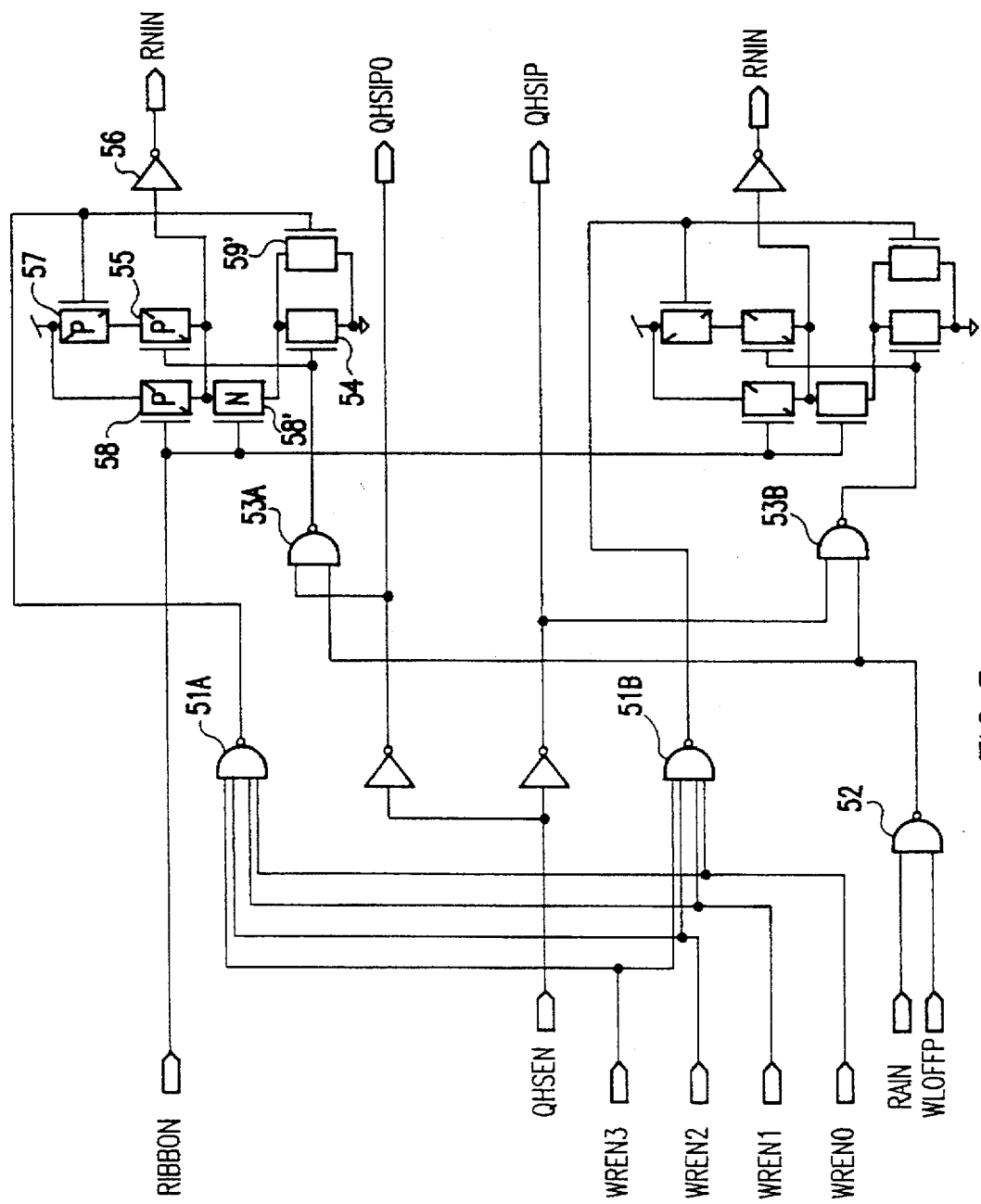
FIG. 5 is a schematic diagram of a preferred form of a word redundancy enable override circuit in accordance with the invention.

The circuit of FIG. 5 represents the predecoder stage of the row input buffer of either of the memory arrays 12A or 12B. The circuit is also preferably configured as two identical circuits for reasons of drive capability in a DRAM of the size assumed for purposes of the present discussion of the invention. Of course, a single circuit may suffice in many applications of the principles of the invention and four or more identical circuits may be necessary in order to obtain suitable operating margins in larger memories or memories with larger partitions. As discussed above, this circuit preferably includes NAND gates 51A and 51B which receive the WREN0–WREN3 signals and provide an active output only when all are of the same (e.g. high) logic state, indicating that no redundant circuit has been substituted at the partial address specified by A0–A9 address bits. The RIBBON input signal is intended to be a generic identification of either of the RIBON0 and RIBON1 signals since the circuit of FIG. 5 is included in the predecoder stage of the row input buffer of both partitions or systems 12A and 12B.

As indicated above, the WREN0–WREN3 signals and the RIBBON signal are the signals most important to the logic function of the circuit of FIG. 5 to develop a disablement function with selective override for the address decoder of a respective one of the row input buffers in systems or partitions 12A and 12B. The remainder of the inputs depicted in this preferred form of this circuit are timing signals which determine the period of enablement of the address decoder of a respective row input buffer which are conveniently applied through this predecoder circuit for reasons not important to the practice of the present invention. Specifically, the word line OFF positive (WLOFFP) is a timing signal derived from the row address strobe (RAS or RASSN) signal or other clock or cycle defining signal applied as an input to the DRAM or other circuit. This signal is a conventional feature of DRAMs for controlling termination of a write-back function to a memory cell in an access cycle in DRAMs including dynamic logic to prevent the signal written back to the cell from propagating as data in a subsequent access cycle when dynamic logic is employed as will be understood by those ordinarily conversant with design of dynamic memory and other integrated circuits. The row address interlock not (RAIN) signal is similarly derived by delay from the RAS or RASSN signal which indicates the beginning of the interval when the signals present on the WREN0–WREN3 lines are considered to be valid and can be reliably evaluated, as is generally provided for signal paths in dynamic logic circuits. The overlap of the inactive state of the RAIN signal with WLOFFP signal detected by NAND gate 52 thus provides a timing window during which the address decoder may be enabled.

The end of the enablement period is determined in response to a quad half select internal not (QHSIN/QHSEN) signal which may be derived in a variety of ways which are not important to the practice of the invention but is generally related to the access cycle period in order that outputs and other circuits implemented in dynamic logic may be disabled before precharge signals are applied preparatory to a subsequent cycle. For this reason, the QHSIN/QHSEN signal is inverted and the resulting QHSIP and QHSIP0 signals output to the address decoders in the row input buffers. In the same manner, the inverted QHSIN/QHSEN signal (active high) is gated with the NANDed RAIN and WLOFFP signals at NAND gates 53A, 53B to control transistors (e.g. 54 and 55) which allow the inputs of inverters (e.g. 56) to be pulled high by a complex logic gate comprising transistors 57, 57', 58, and 58' which develop disable signals and provide for their override.

Specifically, if a combination of signals on the redundant circuit address bus comprising connections WREN0–WREN3 indicates no redundant circuit substitution (e.g. all high), the output of NAND gates 51A, 51B goes low, turning on transistor 57 to pull the input of inverter 56 high when transistor 55 is conductive and transistor 54 is not, as determined by the timing signals discussed above. The output of inverter 56 thus goes to the active low state to enable the address decoder in the row input buffer of the partitions or systems 12A and 12B. It will be recalled from the above discussion of FIG. 1 that during normal access address bit A10 provides selection between partitions or systems 12A and 12B. Further, during refresh, the absence of a substituted redundant circuit will be indicated by a dedicated combination of signals (e.g. all high) on WREN0–WREN3 and address decoder enablement will thus be provided to corresponding memory cells in all partitions by input signal RNIN to the respective row input buffer circuits.

However, when a valid address of a redundant circuit is provided on WREN0–WREN3 (e.g. any line low with the possible exception of all lines low), the input of inverter 56 will not be pulled up through transistor 57, even though transistor 55 may be conductive and transistor 54 will be non-conductive. It should be noted, in this case, that transistor 59' will be conductive, shunting non-conducting transistor 54 during the appropriate time period, assuming the RIBBON (e.g. RIBON0 or RIBON1) is not asserted and transistor 58' is conductive, to thus hold the input to inverter 56 low and its output in an inactive state.

Figure 4:
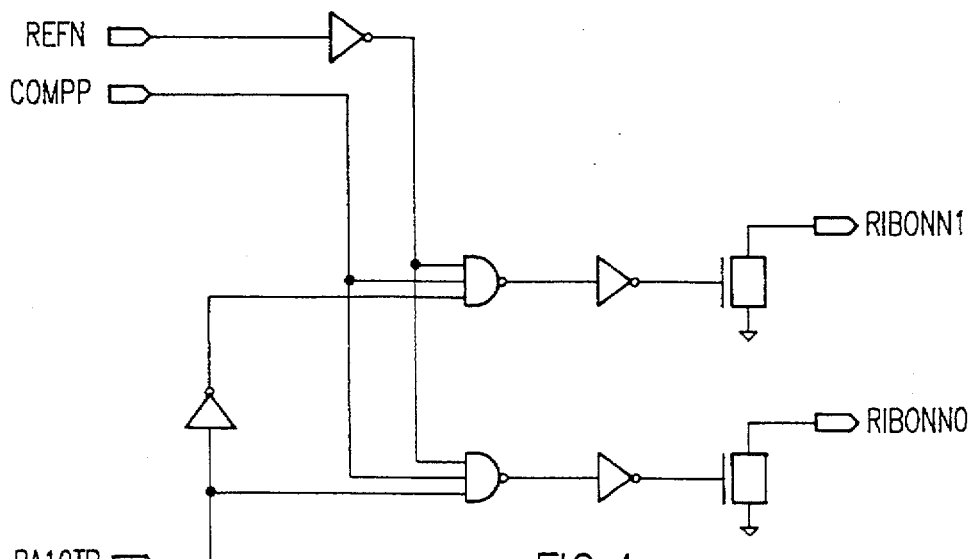
FIG. 4 is a schematic diagram of a preferred form of a row input buffer enable circuit in accordance with the invention.

However, if either RIBON0 or RIBON1, as developed by the circuit of FIG. 4 in response to RA10TP and refresh REFN signals, is active, transistor 58 becomes conductive, shunting nonconductive transistor 57 and transistor 58' becomes non-conductive, disconnecting transistor 57', allowing the input of inverter 56 to be pulled high. Therefore, disablement by a valid address on WREN0–WREN3 may be overridden and a low output provide on RNIN and RNIN0 to provided for refresh of one of systems or partitions 12A, 12B, in which no redundant circuit was substituted, simultaneously with refresh of the redundant circuit substituted in the other system or partition. Thus, since the redundant circuit addresses are not specific to any partition, redundant circuits may be freely allocated to any partition and the selective override of the disablement of refresh permits refresh of all partitions which have not had redundant circuitry substituted simultaneously with refresh of a substituted redundant circuit without risk of driving a defective or marginally operable circuit.

Thus, in accordance with the invention, the number of redundant circuits which are provided need only accommodate the number which may require replacement on an entire chip rather than the number which may require replacement in a single partition multiplied by the number of partitions. Conversely, the invention allows the circuitry on a chip to be freely partitioned as optimization of designs may dictate and particularly for reduction of refresh time without incurring a penalty of circuit complexity or increased requirements for large numbers of redundant circuits and circuitry for their substitution, selection and operation to be fabricated on a chip. Further, the disablement of a word line corresponding to a detected partial address in all partitions with override only in partitions or systems in which no substitution has been made at that address reliably precludes the driving of a circuit for which a substitution has been made.

Figure 6:
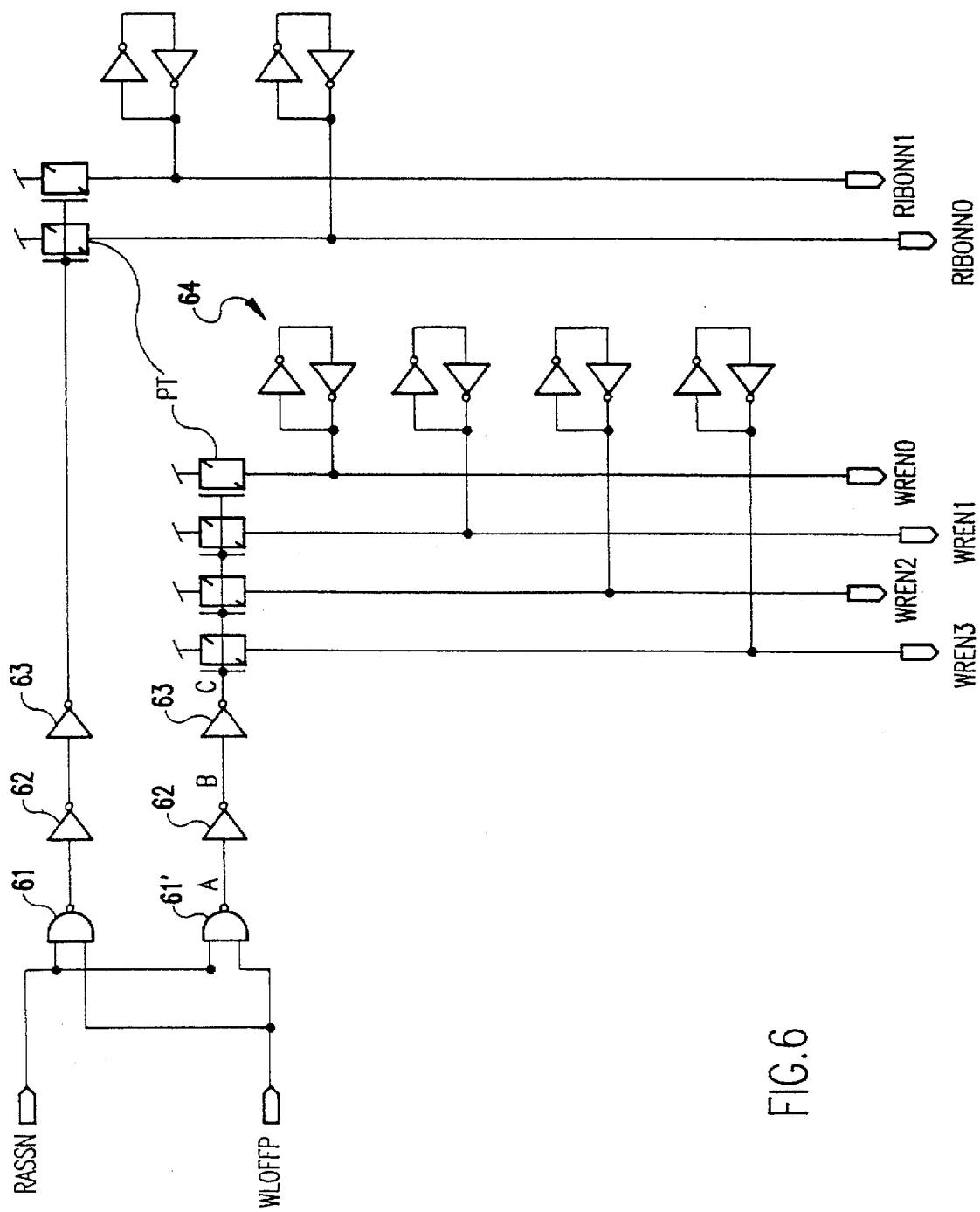
FIG. 6 is a schematic diagram of a preferred form of a precharge circuit for word redundancy enable and row input buffer buses in accordance with the invention.

Referring now to FIG. 6, a precharge circuit for the WREN0–WREN3 and RIBON0–RIBON1 lines will be discussed in the interest of completeness. For purposes of timing, the row address strobe signal RASSN should be inactive and the WLOFFP signal should be active to assure that no circuits are responsive to the voltage developed on any of these lines when precharge is carried out. Since RASSN is active low, this condition is preferably detected with a NAND gate. As with FIG. 5, the circuit of FIG. 6 is preferably divided into two logically identical circuits for increased driving reliability. Accordingly two NAND gates 61, 61' are preferably provided. Further, the overlap of the high level of these pulses is relatively short.

To assure that the circuits responsive to either RASSN or WLOFFP or both are able actually able to respond prior to precharge, a slight delay is provided for the output of each NAND gate by the propagation times of two serially connected inverters 62, 63. The delayed signal is then used to drive precharge transistors PT to a conductive state and pull all of lines WREN0–WREN3 and RIBON0–RIBON1 high. Since the circuits may not be driven during the interval between refresh operations, however, it is considered preferable to maintain the precharge voltage on these lines with latches 64 comprised of small, relatively low conductance latches. The signal latched thereby is readily overcome when the circuit is driven or again precharged and the latching function assists in reliably driving the circuit of FIG. 5 and the redundant circuit decoder/selector in the redundant array 14.

In view of the foregoing, it is seen that the invention provides for freely allocating of redundant circuits among a plurality of partitions in an integrated circuit and particularly where such partitions are provided to expedite refresh operations by simultaneous refresh of corresponding cells in each partition of a DRAM. Driving of a circuit for which a redundant circuit has been substituted is reliably precluded and the number of redundant circuits and their overhead which are required to be formed on a chip for adequate manufacturing yields is minimized.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of operating an electronic device which has been partitioned into a plurality of addressable circuit systems, each including a plurality of circuits and including a plurality of redundant circuits, said method including the steps of detecting a partial address corresponding to one of said circuits within an addressable circuit system for which a redundant circuit has been substituted, disabling energization of the partial address detected in said detecting step in all addressable circuit systems of said electronic device, overriding said disabling step at said partial address in all addressable circuit systems of said plurality of addressable circuit systems of said electronic device in which a redundant circuit has not been substituted for a circuit of said plurality of circuits addressable by said partial address, and driving at least one addressable circuit of said plurality of addressable circuits at a partial address in at least one of said plurality of systems of addressable circuits simultaneously with at least one redundant circuit which has been substituted for at least one addressable circuit of said plurality of addressable circuits at said partial address in another system of said plurality of systems of addressable circuits.

2. A method as recited in claim 1, wherein said disabling step includes the step of detecting a valid address of a redundant circuit of said plurality of redundant circuits.

3. A method as recited in claim 1, wherein said overriding step is performed in response to a refresh operation.

4. A method as recited in claim 1, including the further steps of detecting a combination of digital signals on an address bus which does not correspond to a valid redundant circuit address, and providing an enabling signal to an addressable circuit system of said plurality of addressable circuit systems in response to said detecting of said combination of digital signals.

5. A method as recited in claim 3, wherein said overriding step is selectively performed in response to at least one address bit which is not included in said partial address.

6. An electronic circuit including a plurality of systems of addressable elements, each said system of addressable elements including a plurality of addressable elements, a plurality of redundant circuits which can be substituted for portions of any of said systems of addressable elements, and means for driving at least one addressable element of said plurality of addressable elements at a partial address in at least one of said plurality of systems of addressable elements simultaneously with at least one redundant circuit which has been substituted for at least one addressable element of said plurality of addressable elements at said partial address in another system of said plurality of systems of addressable elements.

7. An electronic circuit as recited in claim 6, wherein said means for driving includes means for detecting a partial address corresponding to an element within a system of addressable elements of said plurality of systems of addressable elements for which a redundant circuit has been substituted, means for disabling energization of the partial address detected by said detecting means in all systems of addressable elements of said electronic circuit, and means for overriding said disabling at said partial address in all systems of addressable elements of said plurality of systems of addressable elements of said electronic circuit in which a redundant circuit of said plurality of redundant circuits has not been substituted at said partial address.

8. An electronic circuit as recited in claim 6, wherein said systems of addressable elements are simultaneously refreshable partitions of a dynamic memory, said electronic circuit further including means for detecting a valid address of a redundant circuit of said plurality of redundant circuits, and means for preventing driving of at least one addressable element in at least one of said plurality of systems of addressable elements in response to detection of said valid address of a redundant circuit of said plurality of redundant circuits.

9. An electronic circuit as recited in claim 6, further including means for detecting a combination of signals on a redundant circuit address bus which does not correspond to a valid redundant circuit address, and means for simultaneously enabling all said systems of addressable elements in response to said means for detecting a combination of signals on a redundant circuit address bus which does not correspond to a valid redundant circuit address and a further signal.

10. An electronic circuit as recited in claim 9, wherein said further signal is a refresh signal.

11. An electronic circuit as recited in claim 7, wherein said means for overriding includes means responsive to at least one address bit not included in said partial address for enabling at least one of said plurality of systems of addressable elements.

* * * * *